(12) United States Patent
Parsons

(10) Patent No.: US 12,514,799 B2
(45) Date of Patent: Jan. 6, 2026

(54) CHEMICAL MEMBRANE COMPLEX REPAIR SOLUTION AND METHOD OF USING THE SAME

(71) Applicant: IUVENI LLC, Chubbuck, ID (US)

(72) Inventor: Camie Parsons, Chubbuck, ID (US)

(73) Assignee: IUVENI LLC, Chubbuck, ID (US)

( * ) Notice: Subject to any disclaimer, the term of this patent is extended or adjusted under 35 U.S.C. 154(b) by 233 days.

(21) Appl. No.: 16/045,678

(22) Filed: Jul. 25, 2018

(65) Prior Publication Data

US 2019/0021965 A1    Jan. 24, 2019

Related U.S. Application Data

(63) Continuation-in-part of application No. PCT/US2018/015124, filed on Jan. 25, 2018.

(60) Provisional application No. 62/450,542, filed on Jan. 25, 2017.

(51) Int. Cl.
```
A61Q 5/00      (2006.01)
A61K 8/22      (2006.01)
A61K 8/36      (2006.01)
A61K 8/65      (2006.01)
A61Q 5/02      (2006.01)
A61Q 5/04      (2006.01)
A61Q 5/06      (2006.01)
A61Q 5/10      (2006.01)
A61Q 5/12      (2006.01)
```

(52) U.S. Cl.
CPC .............. *A61K 8/361* (2013.01); *A61K 8/22* (2013.01); *A61K 8/65* (2013.01); *A61Q 5/002* (2013.01); *A61Q 5/04* (2013.01); *A61Q 5/10* (2013.01); *A61K 2800/43* (2013.01); *A61K 2800/5922* (2013.01)

(58) Field of Classification Search
CPC ... A61Q 5/12; A61Q 5/02; A61Q 5/00; A61Q 5/10; A61Q 5/06; A61Q 5/002; A61Q 5/004; A61K 2800/594; A61K 2800/10
See application file for complete search history.

(56) References Cited

U.S. PATENT DOCUMENTS

| | | | | |
|---|---|---|---|---|
| 4,656,043 A * | 4/1987 | Hawkins | ................. | A61K 8/22 510/124 |
| 4,770,873 A * | 9/1988 | Wolfram | ................. | A61Q 5/12 424/70.2 |
| 6,036,250 A * | 3/2000 | Glatter | ................. | B62D 63/08 296/181.5 |
| 6,420,578 B1 * | 7/2002 | Cawthorne | ............ | A61Q 19/00 554/195 |
| 2004/0146476 A1 * | 7/2004 | Shami | ...................... | A61K 8/46 424/70.14 |
| 2008/0085252 A1 * | 4/2008 | Van | ...................... | A61Q 19/007 424/70.11 |
| 2011/0150804 A1 * | 6/2011 | Nojiri | ..................... | A61K 8/365 424/70.1 |
| 2011/0253161 A1 * | 10/2011 | Obukowho | ............ | A61K 8/922 132/204 |
| 2016/0354292 A1 * | 12/2016 | Obukowho | ............ | A61K 8/361 |

FOREIGN PATENT DOCUMENTS

EP    0091740 A2 *    10/1983    ............... A61Q 5/04

OTHER PUBLICATIONS

McMullen et al., Roger L., "Determination of physicochemical properties of delipidized hair," J. Cosmet. Sci., 64, pp. 355-370, (Sep./Oct. 2013).

Ichihara et al., Ken'ichi, "Preparation of fatty acid methyl esters for gas-liquid chromatography," J. Lipid Res., 51(3), 635-640, Sep. 2009.

Masukawa et al., Yoshinori, "Characterization of the lipid composition at the proximal root regions of human hair," J. Cosmet. Sci., 56, pp. 1-16 (Jan./Feb. 2005).

\* cited by examiner

*Primary Examiner* — Tracy Liu
(74) *Attorney, Agent, or Firm* — HAUPTMAN HAM, LLP

(57) ABSTRACT

Chemical membrane complex (CMC) in hair strands is damaged by exposure to environmental factors, and by hair processing methods that use basic solutions to permanently reshape and/or recolor hair. A CMC repair solution contains components of CMC that repair CMC while cuticle cells are lifted following coloring or perming. Hair treatment with CMC repair solution quenches reactive chemicals on hair and rebuilds damaged CMC on hair. Hair treatment with some embodiments of CMC repair solution lowers cuticle cells by reducing hair pH. Application of CMC repair solution to cuticle-lifted hair strands allows permanent hair reshaping and permanent hair coloring in a single treatment session without loss of cuticle cells or associated hair damage.

18 Claims, 16 Drawing Sheets

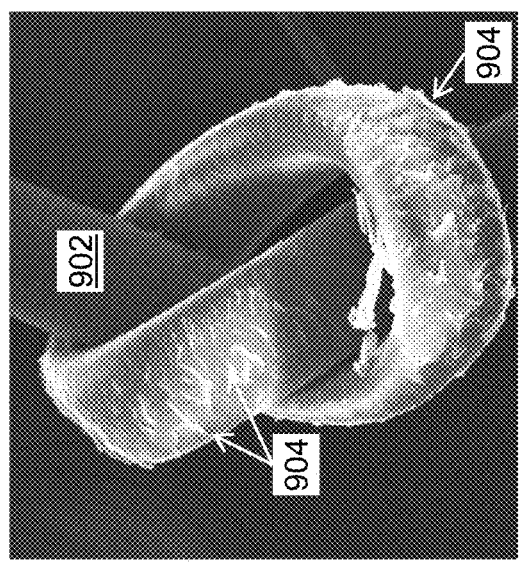
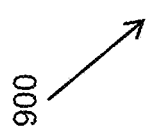
FIG. 9

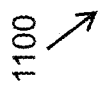

FIG. 11

| Hair Sample | Example # | Test Sample | Example Description | Avgerage Tensile Strength (g/cm) |
|---|---|---|---|---|
| 1 | Example 1 | 1.1 | No Processing or Treatment | 1.806 |
| 1 | Example 2 | 1.2 | Perm & No CMC repair/quench | 1.623 |
| 1 | Example 3 | 1.3 | Color & No CMC repair/quench | 1.683 |
| 1 | Example 4 | 1.4 | Perm + Color & No CMC repair/quench | 1.744 |
| 1 | Example 5 | 1.5 | pH 9 + CMC repair/quench | 1.834 |
| 1 | Example 6 | 1.6 | Perm + CMC repair/quench | 1.738 |
| 1 | Example 7 | 1.7 | Color + CMC repair/quench | 1.798 |
| 1 | Example 8 | 1.8 | Perm + Color + CMC repair/quench | 1.854 |
| 2 | Example 1 | 2.1 | No Processing or Treatment | 1.540 |
| 2 | Example 2 | 2.2 | Perm & No CMC repair/quench | 1.619 |
| 2 | Example 3 | 2.3 | Color & No CMC repair/quench | 1.525 |
| 2 | Example 4 | 2.4 | Perm + Color & No CMC repair/quench | 1.537 |
| 2 | Example 5 | 2.5 | pH 9 + CMC repair/quench | 1.834 |
| 2 | Example 6 | 2.6 | Perm + CMC repair/quench | 1.657 |
| 2 | Example 7 | 2.7 | Color + CMC repair/quench | 1.601 |
| 2 | Example 8 | 2.8 | Perm + Color + CMC repair/quench | 1.629 |

| Hair Sample | Test Sample | Example # | Volume of Extracted Lipids (μL) | | | | |
|---|---|---|---|---|---|---|---|
| | | | Palmitic Acid | Linoleic Acid | Oleic Acid | Stearic Acid | Total Lipids |
| 1 | 1.1 | Example 1 | 15.57 | 38.63 | 38.53 | 19.02 | 111.75 |
| 1 | 1.2 | Example 2 | 10.21 | 31.23 | 26.82 | 15.48 | 83.74 |
| 1 | 1.3 | Example 3 | 10.34 | 36.8 | 31.58 | 17.56 | 96.28 |
| 1 | 1.4 | Example 4 | 11.01 | 31.98 | 27.87 | 16.08 | 86.94 |
| 1 | 1.5 | Example 5 | 14.75 | 51.04 | 41.45 | 21.09 | 128.33 |
| 1 | 1.6 | Example 6 | 17.46 | 45.63 | 43.6 | 14.74 | 121.43 |
| 1 | 1.7 | Example 7 | 18.42 | 40.33 | 27.75 | 19.21 | 105.71 |
| 2 | 2.1 | Example 1 | 14.17 | 40.04 | 31.9 | 29.97 | 116.08 |
| 2 | 2.2 | Example 2 | 3.59 | 33.62 | 21.04 | 9.77 | 68.02 |
| 2 | 2.3 | Example 3 | 11.36 | 30.04 | 39.52 | 24.97 | 105.89 |
| 2 | 2.4 | Example 4 | 9.67 | 36.24 | 39.37 | 18.84 | 104.12 |
| 2 | 2.5 | Example 5 | 20.28 | 54.03 | 40.03 | 31.3 | 145.64 |
| 2 | 2.6 | Example 6 | 13.55 | 58.79 | 23.36 | 16.44 | 112.14 |
| 2 | 2.7 | Example 7 | 20.84 | 48 | 57.36 | 37.74 | 163.94 |

FIG. 13

CHEMICAL MEMBRANE COMPLEX REPAIR SOLUTION AND METHOD OF USING THE SAME

CROSS-REFERENCE TO RELATED APPLICATIONS

The present application is a continuation-in-part of International Application No. PCT Application PCT/US2018/015124, filed on Jan. 25, 2018, and claims the benefit of U.S. Provisional Application No. 62/450,542, filed on Jan. 25, 2017, the entireties of which are incorporated herein by reference.

BACKGROUND

Hair modification includes modifying hair color and hair conformation (the shape, or degree of curliness of hair strands). Hair modification is temporary or permanent, according to a type of hair processing undertaken. Temporary hair coloring includes applying a hair colorant to the outside of hair strands, which colorant washes off with water or wears off with time and hair movement. Temporary hair reshaping includes tensioning or molding hair with exposure to heat, water, or stiffening compounds applied to an exterior surface of hair strands to shape a hair strand before the hair strand relaxes to an original conformation, or before the stiffening compounds wear off.

Permanent, or durable, hair coloring involves chemically modifying hair strands. Permanent, or durable, hair coloring is characterized by the persistence of new hair color after exposure to sun, water, or other chemical processing. Darkening hair strands involves processing hair strands to place dyes or colorants at an interior portion of the hair. Lightening hair strands involves processing hair with hydrogen peroxide or a bleaching agent to remove melanin or other hair colorants on hair strands, before adding dyes or colorants at an interior portion of the hair. During chemical hair processing, interior portions of hair strands, including the cortex and/or the medulla, are uncovered by application of a basic (e.g., pH > about 8.5) solution to the hair that lifts the hair cuticle cells to a raised or lifted position. Chemical processing with basic solution causes hair damage. Hair damage includes roughness, brittleness, and/or breakage.

Permanent hair reshaping (e.g., perming or straightening) involves cleaving and reforming disulfide bonds at interior portions of hair strands while the hair strands are held in a new conformation, different from the original hair conformation. Disulfide bonds cleaved during perming re-form while hair is in the new conformation, locking the hair strand in a new shape. Locking the hair strand involves forming new disulfide bonds within the hair strands. Like chemical processing to color hair, chemical hair processing to perm hair involves application of basic (e.g., pH >about 8.5) solution to raise the cuticle cells and direct perming chemicals to an interior portion of the hair and causes hair damage.

BRIEF DESCRIPTION OF THE DRAWINGS

The present application can be best understood from the following detailed description when read with the accompanying figures. It is emphasized that, in accordance with the standard practice in the industry, various features are not drawn to scale and are used for illustration purposes only. In fact, the dimensions of various features may be arbitrarily increased or reduced for clarity of discussion.

FIG. 9 is an SEM image of a processed, treated hair strand, according to an embodiment.

FIG. 11 is a table of tensile strength data for hair samples, according to an embodiment.

FIG. 13 is a table of amounts of extracted lipids from hair samples, according to an embodiment.

DETAILED DESCRIPTION

Figure 1:
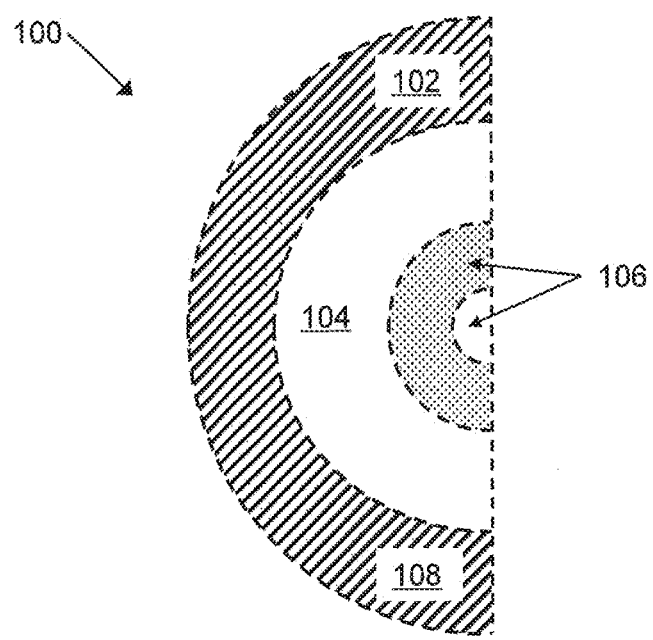
FIG. 1 is a cross-sectional diagram of a hair strand, according to an embodiment.

The following disclosure provides embodiments, or examples, for implementing different features of the provided subject matter. Specific examples of compounds, components, values, operations, materials, arrangements, etc., are described below to simplify the present application. These are, of course, merely examples and are not intended to be limiting. Other compounds, components, values, operations, materials, arrangements, etc., are contemplated. The use of one compound, alone or in a mixture, does not preclude the use of a similar compound in a same chemical family for an intended purpose, or the use of a different chemical compound that can be substituted alone or in a mixture without adverse effect, to achieve a similar result as the first compound. The use of a mixture of compounds does not preclude the use of a different mixture with different proportions of the compounds. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of elements of the specification. The elements of the specification may be interpreted in different orientations.

Hair modification, whether coloring or reshaping (including adding or removing curl) hair, is a widespread practice for altering personal appearance. Hair coloring and reshaping are accomplished by chemical processing of hair strands. Hair coloring is accomplished by adding hair colorant to hair strands. Permanent hair coloring includes both lightening and darkening of hair strands. In some permanent hair coloring processes, hair is lightened before permanent hair dye is applied to hair strands. In some hair permanent coloring processes, hair is dyed without any lightening steps. Although some permanent, or durable, hair coloring processes are reversible by application of lightening agents or bleaches, in the present disclosure, the term "permanent" is interpreted to mean "durable," but for application of lightening agents or bleaches or exposure to environmental factors that degrade hair color. No aspect of the present disclosure should be interpreted to mean that "permanent" correlates with an irreversible chemical modification to hair color under all circumstances. Permanent hair reshaping is accomplished by modifying a chemical structure and a physical structure of hair strands. In permanent hair reshaping, chemical reactions that break and re-form disulfide bonds modify the physical and chemical structure of hair strands.

Permanent hair modification involves the use of a high-pH solution, typically with a pH greater than about 8.5, to lift cuticle cells and allow passage of chemicals that lighten, dye, or reshape hair strands into an interior portion of the hair strand. High-pH solution damages a layer of cell membrane complex (CMC) on an outside of hair strands. The present disclosure relates to a chemical treatment and method of using the chemical treatment to repair damaged cell membrane complex. In some embodiments, repairing damaged cell membrane complex restores the texture and tensile strength of hair strands.

FIG. 1 is a diagram of a hair strand 100. Hair strand 100 includes cuticle 102, cortex 104, and medulla 106. In some embodiments of hair strands the medulla is absent. Medulla 106 includes cells and air spaces. A proportion of air space in the medulla of a hair strand varies according to the type of hair being considered. Cuticle 102 includes a number of cuticle cells 108. Cuticle cells 108 fasten to cortex 104 at one end and are layered with other cuticle cells in a relaxed or lowered position. Cuticle cells 108 retain moisture in hair strand 100 and protect interior portions of hair strand 100, including cortex 104 and medulla 106, from damage. Cuticle cells 108 are raised or lifted from the lowered position into a raised position by application of basic solution to a hair strand 100. Basic solution that raises cuticle cells 108 has a pH greater than about 8.5. Cuticle cells are lowered toward cortex 104 by neutralizing the basic solution on hair strand 100. Neutralizing solution has a pH <about 7.5. Hair has a pH of about 5.5. Some embodiments of neutralizing solutions have a pH of about 5.5 to return hair strands to an original pH. When neutralizing solution is not applied to hair strands with lifted cuticle cells, cuticle cells lower with the passage of time, as natural compounds from skin modify hair pH.

Hair characteristics are related to a location of hair strands on an organism's body and on a genetic characteristic of the organism. Hair strands have different diameters, different numbers of cuticle cells layered on the cortex, different cross-sectional shapes, different cortex thicknesses, and so forth. Melanin in cortex 104 imparts color to hair strand 100. A concentration of naturally-occurring melanin in cortex 104 varies according to a person's age and/or genetic makeup. Natural levels of melanin in a cortex layer generally decrease over time as a person ages. Darkness and color of hair strands decrease as the amount of melanin in hair strands decrease. Hair that contains no melanin is translucent or white.

Cuticle 102 includes an outer layer of cells (cuticle cells 108) that each connect, at one end, to cortex 104. Cuticle cells 108 lay against cortex 104 and adjoining cuticle cells to form a multi-layered structure at the outside of hair strand 100. Hair strand 100 also contains at least one type of cell membrane complex, a complex of lipid layers, proteins, and amino acids that covers surfaces of hair cells and fills spaces between cuticle cells, between cuticle cells and the cortex, and within spaces of the cortex. Different types of hair, and different locations on a hair strand, have different types and quantities of cell membrane complex. CMC includes lipids or terminal fatty acids having a main, or longest, carbon chain length greater than 12 atoms. A terminal fatty acid is a lipid with a carboxyl group at an end of a longest chain of carbon atoms of the fatty acid. Terminal fatty acids in CMC include branched fatty acids, unbranched fatty acids, saturated (no double bonds) fatty acids, and unsaturated fatty acids (having at least one double bond). Proportions of the components of CMC varies across a hair strand, and between different types of hair strands. CMC helps to protect and strengthen hair from environmental damage, including sun, dirt, and chemical exposure. CMC swells in the presence of water. Openings in CMC provide a pathway for compounds to enter the interior portion of hair strands during chemical processing associated with perming or coloring hair.

Figure 2:
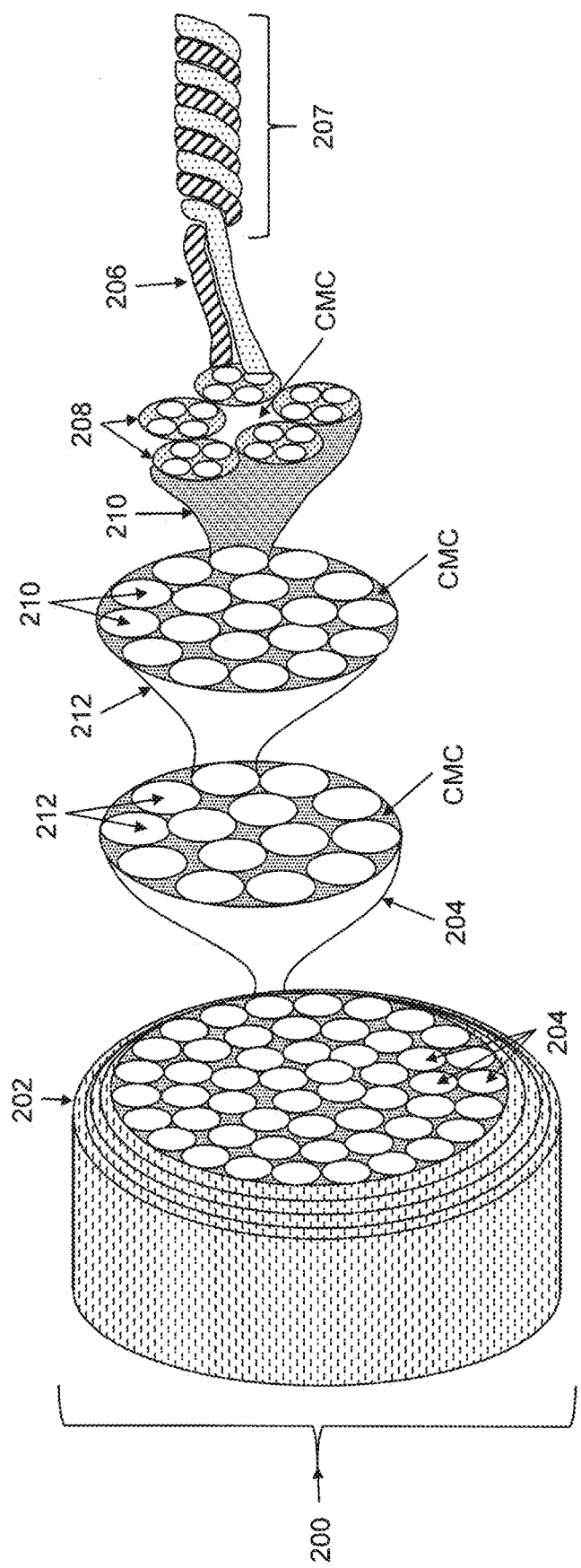
FIG. 2 is an exploded diagram of a hair strand, according to an embodiment.

FIG. 2 is an exploded diagram of a hair strand 200, according to an embodiment. Hair strand 200 includes cuticle layers 202 surrounding cortical cells 204. Cortical cells 204 contain structured fibers that provide strength and flexibility for hair strand 200. Structured fibers in cortical cells 204 have a hierarchical structure. For each pair of polypeptide molecules in a hair strand, a positively charged end of one polypeptide molecule aligns with a negatively charged end of a second polypeptide molecule and the two polypeptides entwine (see entwined region 207) to form a dimer 206. Dimer 206 aligns end-to-end with other dimers in hair strand 200 along a length of hair strand. Some end-to-end chains of dimers align alongside other end-to-end chains of dimers, the dimer-pair ends of one end-to-end chain being offset from the dimer-pair ends of the second end-to-end chain.

Protofilaments 208 include two dimers 206 that run alongside each other. A plurality of protofilaments 208 combine together to form an intermediate filament 210, and a plurality of intermediate filaments 210 are joined together to form a macrofibril 212. Each cortical cell 204 includes a plurality of macrofibrils 212.

Hair forms in a follicle in skin. A follicular end of hair strand 200 is located in the follicle and remains in the follicle while hair strand 200 elongates and extends out of the follicle by the formation of additional dimers 206 in the follicle. A distal end of hair strand 200 is not fastened to skin in a hair follicle. Without being bound by theory, the quantity and quality of CMC at an end closest to the hair follicle, the proximal or follicular end, is better than the quantity and quality of CMC at an end of a hair strand farthest from the follicle, the distal end. At the distal end, hair has been exposed to light, dirt, and heat, resulting in CMC damage. Chemical processing, such the processing associated with permanently reshaping or coloring hair, is more likely to have occurred for the distal end than the proximal end because the distal end is older than the proximal end. In some embodiments of chemical hair processing, new hair is colored at or near the scalp to color match the new hair to older hair further from the follicle, damaging the new hair soon after emergence from the follicle.

Figure 10:
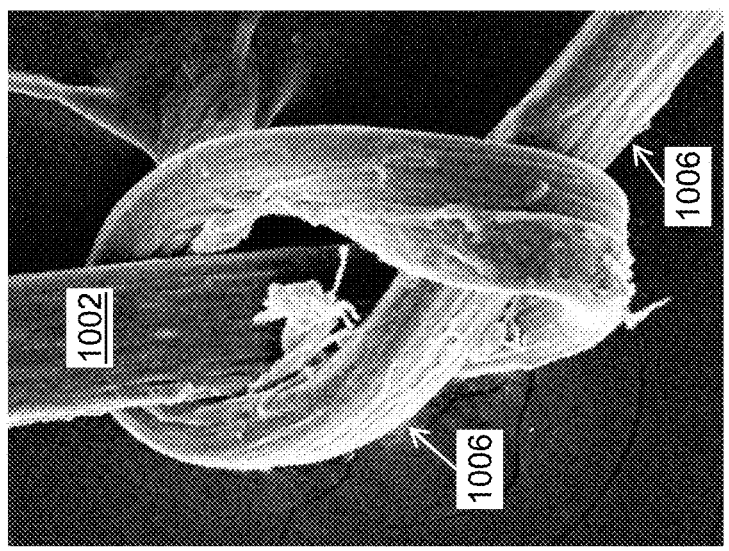
FIG. 10 is an SEM image of a processed hair strand without cell membrane complex (CMC) repair treatment, according to an embodiment.

Chemical processing to permanently color or perm hair reduces the amount of damage hair experiences by reducing the exposure time of the hair to the chemical solutions used in the chemical processes. Excessive exposure times, or repeated exposures, leads to cumulative hair damage. In some embodiments of chemical processing, permanent hair damage occurs. In some embodiments of permanent chemical processing, the cuticle cells of the hair are stripped away, as shown in FIG. 10, and the hair is permanently embrittled and structurally compromised. Some chemical processing methods restrict the area to which processing chemical are applied to avoid damaging hair outside a processing region of the hair strand. Methods of addressing hair damage subsequent to chemical processing, or in the absence of chemical processing, include the application of conditioners or emollients to hair cells after shampooing to smooth or detangle hair strands.

Figure 3:
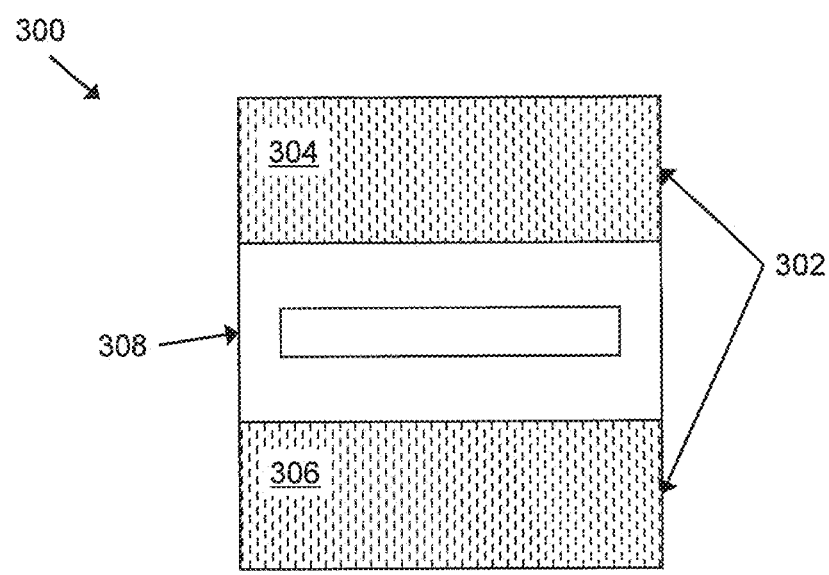
FIG. 3 is a diagram of a cell membrane complex, according to an embodiment.

The present application describes aspects of a CMC repair process or hair treatment process using a hair treatment solution, also called a CMC repair solution, that repairs hair damage associated with loss of the protective CMC layer, or a cell membrane complex structure. FIG. 3 is a diagram of a protective CMC layer, or a CMC structure. CMC includes several layers that combine to provide hair protection and to strengthen hair. In the present application, the term "chemical processing" is used to refer to methods and operations associated with raising cuticle cells, permanently modifying hair color, and permanently modifying hair shape (e.g., penning or chemically straightening hair). The term "chemical treatment" is used to refer to methods and operations associated with restoring and/or rebuilding a CMC layer on hair strands after chemical processing. Chemical treatment, as used herein, is also called "quenching," and the chemical mixture used to perform quenching is called "quencher" or "CMC repair solution." One aspect of quencher or CMC repair solution is that the solution has a pH of less than 6.0, which lowers the cuticle cells when applied to hair strands. One aspect of quencher or CMC repair solution is that the solution neutralizes residual base on hair strands after cuticle lifting. One aspect of quencher of CMC repair solution is that the solution neutralizes hydrogen peroxide on hair strands. Hydrogen peroxide triggers formation of permanent dye molecules during hair coloring, and triggers formation of disulfide bonds during perming, to lock hair into a new shape. One aspect of quencher or CMC repair solution is that the solution contains a mixture of fatty acids, and/or other lipids, proteins, and amino acids that are naturally found in CMC on hair strands. When damaged CMC is exposed to quencher or CMC repair solution while the cuticle cells are lifted, the fatty acids, and/or other lipids, proteins, and amino acids that are found in CMC repair solution combine with the damaged CMC on hair strands to rebuild the CMC layer and protect the hair strands. Some embodiments of CMC repair solutions include hydrolyzed keratin protein to supplement or restore materials lost from the delta layer of CMC. Some embodiments of CMC repair solutions include fatty acids and/or other lipids for addressing damage to beta layers of CMC. CMC repair solution increases the total lipid content of hair strands, including the interior portion of hair strands.

Figure 14:
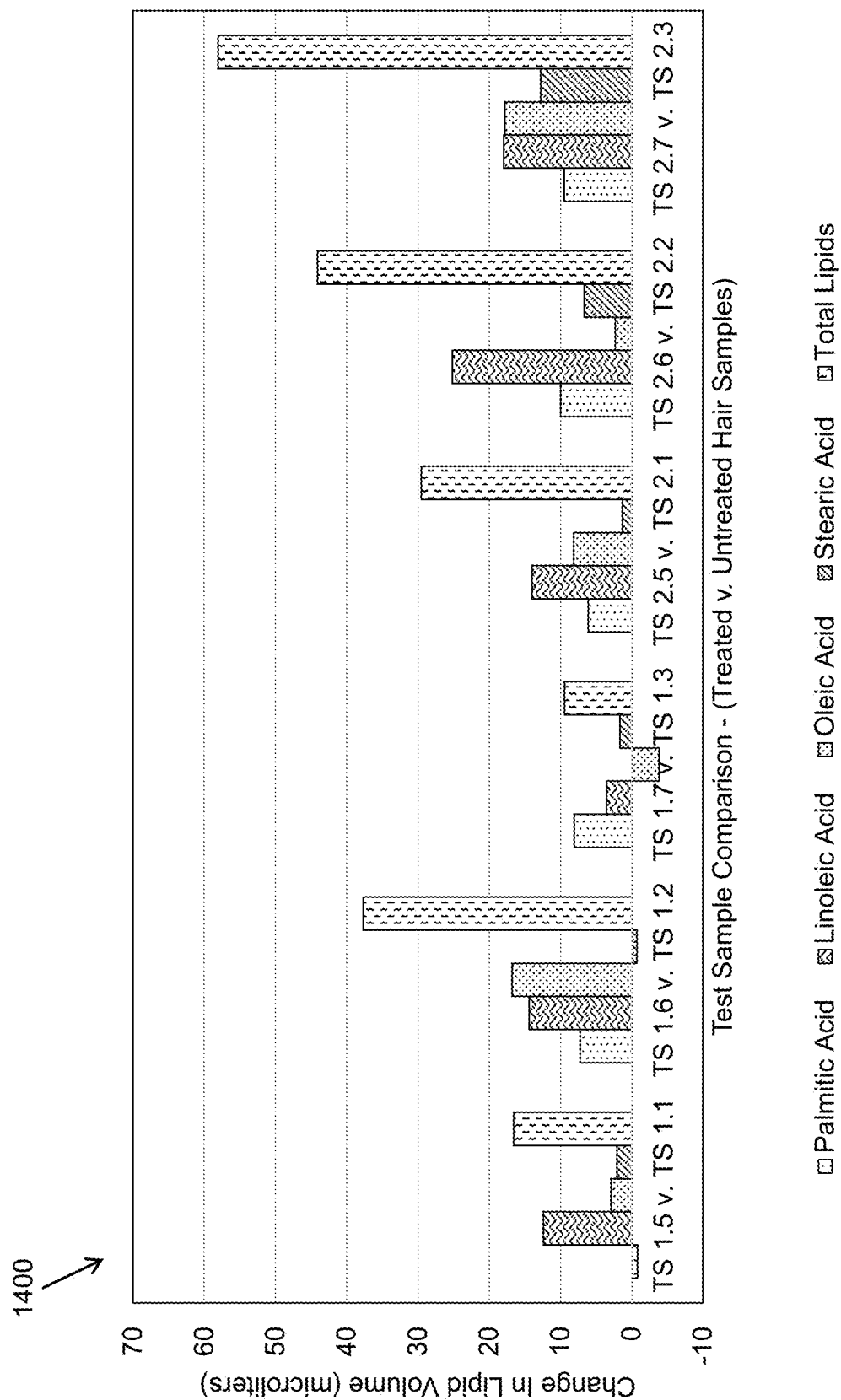
FIG. 14 is a chart of a difference in extracted lipids between hair samples, according to an embodiment.

Without being limited by theory, the repairing and/or restoring of CMC on hair strands is believed to involve spontaneous self-assembly of CMC repair solution ingredients on surfaces of hair cells to replace removed and/or damaged portions of CMC. It is believed that application of CMC repair solution to hair strands while the cuticle is in a lifted position improves hair softness, tensile strength or elasticity, and pliability, by restoring lipids of the CMC to hair strands. CMC repair solution rebuilds CMC both on the outer surface of hair, and at interior portions of the hair. Because CMC repair occurs while the pH of treated hair strands is being restored to about 5.5, CMC rebuilding at an interior portion of hair occurs before, or while, the cuticle lowers to a lowered or resting position. FIG. 14 is a chart of differences in total lipid content extracted from interior portions of hair strands that have been either [a] chemically processed, or [b] chemically processed followed by treatment with CMC repair solution. Additional discussion of FIG. 14 is included below.

Conditioners and/or detanglers are applied to hair strands while the hair is wet, but the cuticle is lowered, which restricts the ability of compounds added to hair by the conditioner and/or detangler to entering an interior portion of the wet hair. CMC repair solution is applied to hair when the cuticle cells are lifted, increasing access of the repair components to interior portions of the hair. CMC repair solution ingredients do not interfere with formation of dyes on hair strands, and do not damage hair reshaping processes on hair strands. In some methods described herein, CMC repair solution repairs hair after a cuticle-lifting operation with basic solution (e.g., pH of around 9.0) without any chemical processing. The subject matter of the present application relates to any situation in which CMC repair and/or restoration is desired.

FIG. 3 is a diagram of a cell membrane complex 300, according to some embodiments. A CMC layer, or a CMC structure, has different compositions at different locations through a hair strand. Cuticle CMC is found on and between cuticle cells of the hair strand (e.g., when cuticle cells are in a lowered position, CMC fills space between cuticle cells, protecting the cuticle cells as they move (raise and lower), and preventing damage from light, dirt, or other environmental factors). Cuticle-cortex CMC is found at an interface between cuticle cells and the hair cortex below the cuticle cells. Cortex-cortex CMC is found between cortex cells of the hair strand and is generally not in contact with cuticle CMC or cuticle-cortex CMC. The different types of CMC described herein include different proportions of the compounds used in CMC repair solution, and have different thicknesses according to the position of the CMC on the hair strand.

Cell membrane complex 300 includes a lipid bilayer 302 with first lipid layer (first beta layer, or upper beta layer) 304 against the membrane of one cuticle cell in a hair strand, and second lipid layer 306 (second beta layer, or lower beta layer) against the membrane of a second cuticle cell of the hair strand. Delta layer 308 is situated between and against first lipid layer 304 and second lipid layer 306. During cuticle raising processes, water swells the CMC, the delta layer is sheared and exposed to the chemical solution used to raise the cuticle cells, and some of the first lipid layer, the second lipid layer, or both lipid layers in a region of CMC, are also exposed to the high-pH cuticle raising solution. High-pH cuticle raising chemical solution has a pH of at least 8.0, although a pH of between 9 and 12 is most widely used in commercially available hair perming and hair coloring kits. Upon exposure to strong bases in cuticle raising solution, portions of lipid bilayers and/or the delta layer dissolve and/or lift off and separate from hair strands, leaving portions of the hair strands unprotected by a CMC layer. In some embodiments, remaining CMC layers are thinned compared to an original or pre-processing CMC thickness. Hair with thin or missing CMC is more prone to damage than hair with normal-thickness or undamaged CMC.

In an embodiment, CMC 300 is a cuticle-cuticle CMC layer, where the first lipid layer 304 is an upper beta layer against a first cuticle cell, the second lipid layer 306 is against a second cuticle cell, and the delta layer 308 is located between first and second lipid layers. In cuticle-cuticle CMC layers, the lipid layers contain some free fatty acids, and some fatty acids that are covalently bonded to the cortical cell membranes of the upper and lower cuticle cells. In some embodiments, CMC 300 is a cortex-cortex CMC layer, wherein the first and second lipid layers contain free fatty acids, cholesterol and/or cholesterol sulfate, and ceramide. In some embodiments, CMC 300 is a cuticle-cortex CMC layer, the first lipid layer 304 is against a cuticle cell, the second lipid layer 306 is against the hair cortex, and the delta layer 308 adheres to one or both lipid layers of the lipid bilayer when the cuticle cells of the hair strand are in a lowered position.

In human hair strands, approximately 50% w/w of the bound fatty acid molecules in CMC are 18-methyleicosanoic acid (18-MEA, Chemical Abstracts Number 506-30-9), a branched-chain (or substituted) terminal fatty acid. Numbering of the atoms of a carbon chain in fatty acids or other molecules described herein begins with the carboxyl group, or carboxylic acid, carbon ("C1") and ends with the carbon a largest number of carbon-carbon bonds away from the carboxylic acid carbon atom, C1. Carbon atoms are enumerated C1, C2, and so forth up to the most distant carbon atom. Carbon-carbon single bonds, double bonds, and triple bonds are treated identically for purposes of numbering the carbon chain. The main chain of a terminal fatty acid is the longest possible continuous chain of contiguous carbon atoms that can be enumerated from the C1 position in the fatty acid.

18-MEA stands out from other known fatty acids in human hair CMC because 18-MEA has an odd number of carbon atoms (21 total carbon atoms), and because 18-MEA is branched-chain fatty acid (alkyl-based substituent being a methyl group substituent located at C18). Other known fatty acids in human hair CMC are unbranched, straight-chained, and/or have an even number of total carbon atoms (e.g., 14, 16, 18 carbon atoms, and so forth). 18-MEA is found primarily in cuticle-cuticle CMC and in cuticle-cortex CMC. Unbranched, straight-chained, even-numbered fatty acids are found in cortex-cortex CMC, cuticle-cuticle CMC, and in cuticle-cortex CMC.

CMC repair solution includes at least one branched fatty acid to repair and restore missing 18-MEA in CMC, including cuticle-cuticle CMC and cuticle-cortex CMC. A preferred embodiment of CMC repair solution includes 18-MEA as the principal branched fatty acid for repairing and/or restoring CMC throughout hair strands. Some embodiments of CMC repair solution include unbranched, even-numbered fatty acids to replenish the both the beta layers of lipid bilayers throughout a hair strand, and the CMC delta layer in various types of CMCs.

Fatty acids described herein may be sourced from oils produced by many types of plant species. Avocado oil, walnut oil, peanut oil, canola oil, and corn oil are among the naturally occurring oils that have mixtures of lipids and fatty acids therein. The lipids and fatty acids in natural oils include including branched and unbranched terminal fatty acids, and include saturated and unsaturated terminal fatty acids. Fatty acids in natural oils such as avocado oil, walnut oil, peanut oil, canola oil, and corn oil include linoleic acid, oleic acid, stearic acid, and palmitic acid. Other natural oils are contemplated within the scope of the present disclosure as a source of lipids and fatty acids for formulating CMC repair solution.

CMC repair solution also contains hydrolyzed keratin proteins to promote strengthening/rebuilding of the delta layer in CMC in amounts of 1%-8%. Hydrolyzed keratin is keratin protein that has been broken down into component amino acids. CMC includes one or more of the following component amino acids: alanine (Ala), arginine (Arg), asparagine (Asp), cysteine (Cys), glutamic acid (Glu), glycine (Gly), histidine (His), isoleucin (Ile), leucine (Leu), phenylalanine (Phe), proline (Pro), serine (Ser), threonine (Thr), tryptophan (Trp), tyrosine (Tyr), and valine (Val).

Although 18-MEA is the most common branched fatty acid found in naturally occurring CMC, branched terminal fatty acids other than 18-MEA that form complexes with 18-MEA are also envisioned with the scope of the present disclosure. Other suitable branched fatty acids include terminal fatty acids with a substituent located at the C18 position, or from C15 to C21, such that the substituent can participate in van der Waals attraction with either the main carbon chain of an adjoining 18-MEA molecule, or, preferably, the methyl substituent of the 18-MEA in a CMC lipid layer surrounding a replacement branched fatty acid. In some embodiments, the substituent is an alkyl substituent. In some instances, the substituent is a saturated hydrocarbon such as an ethyl group, a propyl group, or an isopropyl group. In some embodiments, the substituent is an unsaturated hydrocarbon. In some embodiments, the main carbon chain of a replacement branched terminal fatty acid has a carbon chain of up to 25 carbon atoms. Some embodiments of CMC repair solution include a single replacement branched terminal fatty acid. Some embodiments of CMC repair solution include multiple replacement branched terminal fatty acids. In some embodiments, the replacement branched terminal fatty acid has two saturated hydrocarbon substituents attached to the main carbon chain at carbon atoms ranging from C15 through C21. In some embodiments of CMC repair solution with a doubly-substituted replacement branched terminal fatty acid, a first saturated hydrocarbon substituent attaches to the main carbon chain at a position ranging from C15 through C21, and a second saturated hydrocarbon substituent attaches outside the range of C15-C21. In some embodiments of CMC repair solution, a main carbon chain of the branched fatty acid component molecule has two matching saturated hydrocarbon substituents (e.g., two methyl groups, two ethyl groups, and so forth). In some embodiments, a main carbon chain of the branched fatty acid component molecule has two different saturated hydrocarbon substituents. Replacement branched fatty acids with multiple substituents are believed have greater van der Waals attraction between the branched terminal fatty acid molecules in CMC, especially the cuticle-cuticle CMC, than singly-substituted branched terminal fatty acids, or unbranched terminal fatty acids. It is believed that van der Waals attraction is the primary force that drives the formation of repaired CMC films on hair cell surfaces upon application of CMC repair solution to the hair cells.

Some embodiments of CMC repair solution include unbranched terminal fatty acids. Some embodiments of CMC repair solution include a single unbranched terminal fatty acid. Some embodiments of CMC repair solution include mixtures of unbranched terminal fatty acids. In some embodiments, unbranched terminal fatty acids have a main carbon chain length of at least 12 carbon atoms, but not more than 30 carbon atoms, although longer chain lengths are also envisioned. In some embodiments, an unbranched terminal fatty acid in CMC repair solution is a saturated (i.e., without double bonds). In some embodiments, an unbranched terminal fatty acid in CMC repair solution is an unsaturated having up to 3 double bonds. In some embodiments of CMC repair solution, a double bond of an unbranched fatty acid has a cis orientation. In some instances, the double bond in an unsaturated terminal fatty acid has a trans configuration. Examples of unbranched fatty acids with two or more double bonds may have various types of double bonds, wherein the double bonds comprise at least two cis, at least two trans, or one cis and one trans double bond.

In some embodiments, CMC repair solution includes one or more of the saturated unbranched terminal fatty acids: palmitic acid (IUPAC name "hexadecanoic acid", CAS number 57-10-3), and stearic acid (IUPAC name "octadecanoic acid", CAS number 57-11-4). In some embodiments, CMC repair solution includes one or more of the unsaturated unbranched terminal fatty acids: oleic acid (IUPAC name "(9Z)-Octadec-9-enoic acid", CAS number 112-80-1) and linoleic acid (IUPAC name "(9Z, 12Z)-9,12-octadecadienoic acid", CAS number 60-33-3). Although palmitic acid, stearic acid, oleic acid and linoleic acid are among the terminal fatty acids of naturally found in a hair CMC layer, other unbranched fatty acids having a main chain length of at least 12 and not more than 30 carbon atoms are also suitable for inclusion in CMC repair solutions. Terminal fatty acids having double bonds at different positions that those of linoleic acid (e.g., at C9 and C12 positions) and oleic acid (e.g., the C9) position are also envisioned, as are fatty acids having a single double bond, or three or more double bonds. It is believed that a wide range of unbranched and unsaturated terminal fatty acids are compatible with CMC repair solution, provided that the overall shape of the unsaturated fatty acid molecule, when surrounded by, a branched terminal fatty acid, such as 18-MEA, in a lipid layer, does not disrupt the van der Walls forces between the other fatty acid molecules.

As described above, some embodiments of CMC repair solution perform a quenching process to terminate chemical reactions occurring on hair strands during hair treatment after chemical processing. Quenching of permanent hair coloring processes includes neutralizing of basic chemicals left on hair strands after lifting cuticle cells, and/or neutralizing of hydrogen peroxide used to generate permanent dye molecules from dye molecule precursors applied to hair strands during permanent hair coloring. Quenching of permanent hair reshaping, or perming, processes includes neutralizing of basic chemicals left on hair strands after lifting cuticle cells, and/or neutralizing of hydrogen peroxide used to re-form disulfide bonds in hair strands to lock hair strands into new shapes.

Some embodiments of CMC repair solution are applied to hair strands to lower cuticle cells that are still in a raised position after rinsing hair with water. Chemical processing to permanently color hair involves rinsing the cuticle-raising high-pH solution with water prior to adding dye molecule precursors and hydrogen peroxide to trigger permanent dye molecule formation. Such a water rinse leaves the hair in a cuticle-raised configuration while the dye molecule precursors and hydrogen peroxide added to the hair access an interior portion of the hair strands. Chemical processing to permanently reshape hair involves rinsing the high-pH solution with water prior to adding hydrogen peroxide lock hair in a new shape by reforming cysteine disulfide bonds. The water rinse leaves the hair in a cuticle-raised configuration to allow the hydrogen peroxide access to an interior portion of hair strands while the cysteine disulfide bond formation occurs. In chemical processing, after a final water rinse, either to remove excess peroxide and dye molecules when coloring, or to remove peroxide basic solution from hair strands when perming, the hair strands gradually return to a normal hair pH range ($4.5 \leq pH \leq 5.5$). Natural pH restoration occurs upon exposure of the hair strands to compounds naturally secreted by skin cells. Such a return to normal hair pH ranges can take several days, during which time hair may be damaged by sun, dirt, or other chemicals, because the cuticle cells are not completely lowered.

A cuticle cycle is begins when the cuticle cells are raised by application of a high-pH solution to initiate chemical processing of hair. A cuticle cycle is complete when the raised cuticle cells return to a fully lowered position. An acidic CMC repair solution quenches peroxide and base reactions, ending a cuticle cycle within minutes of applying the solution. Residual hydrogen peroxide, that could lighten hair if left on hair strands after perming or coloring, is decomposed, and residual base or reducing agent is also neutralized. Products of peroxide decomposition or base neutralization are removed from hair with water rinsing. CMC repair solution that lowers cuticle cells has a pH, with or without buffering, of $\leq 6$. In some embodiments, CMC repair solution, also called quencher solution, is buffered to a pH of between 4.0 and 5.5. In some instances, a pH of quencher solution ranges from about 3.0 to about 6.0. In some instances, CMC repair solution is buffered with acetic acid/sodium acetate, although other buffer systems are also envisioned.

As described above, CMC repair solution contains one or more branched terminal fatty acids, such as 18-MEA, where an amount of branched terminal fatty acid ranges from about 1% to about 10% total solution volume, although higher concentrations are also within the scope of the present disclosure. In some instances, CMC repair solution includes one or more unbranched terminal fatty acids, such as steric acid, palmitic acid, oleic acid, and linoleic acid, or combinations thereof. In some instances, CMC repair solution also includes other unbranched terminal fatty acids having a main carbon chain length of not less than 12 carbons to not more than 25 carbons. CMC repair solution contains between about 3% total volume to about 20% total volume of unbranched and branched fatty acids, although higher total concentrations are also envisioned. Concentrations below 3% total volume are able to provide some CMC repair function, but perform at a lower reaction rate, and with an extended application time, in comparison to total lipid volumes between 3% and 20%. In some embodiments, CMC repair solution contains one or more of the essential fatty acids steric acid, palmitic acid, oleic acid, or linoleic acid at individual volumes ranging from about 1% to about 8% of total solution volume, and a total volume of unbranched and branched fatty acids of not more than 20%. Solutions having an individual lipid volume greater than 8%, or a total lipid volume greater than 20%, function as CMC repair solution, but waste ingredients. The overall CMC repair rate of processed hair does not increase significantly for individual lipid volumes greater than 8%, or for total lipid volumes greater than about 20%. An amount of lipid in excess of these thresholds is rinsed from hair after a CMC repair solution treatment without increasing the total lipid content of hair or significantly decreasing the treatment time. Solutions having less than 1% total volume of fatty acids are less effective at repairing and/or restoring hair CMC, even for extended treatment times (beyond the time used to treat hair with a solutions having an individual lipid volume greater than 8%, or a total lipid volume greater than 20%), although some slight hair lipid composition improvement is measurable.

Solutions having less than about 2% total volume of branched terminal fatty acids, whether a single fatty acid, such as 18-MEA, or a mixture of fatty acids, as described above, are less effective at repairing CMC beta layers than solutions having a concentration of branched terminal fatty acid above 2% total volume. CMC repair solutions having greater amounts of fatty acids, lipids, and 18-MEA than described herein have the desired CMC-repairing functionality, but leave residual CMC components on hair strands that are removed by water or shampoo when hair is washed. Application of CMC repair solutions having only fatty acids, without water, are effective at restoring CMC structure on hair strands, but do not have the same cuticle lowering function as acidic aqueous CMC repair solution as described above. Further, pure CMC repair solutions having only fatty acids, without water, are ineffective at terminating reactions of hydrogen peroxide and/or the reducing agent on hair strands, and triggering formation of permanent dye molecules, as is described below. In some instances, CMC repair solution has not less than 5% water with a pH between 4.0 and 6.0 and not more than 3% w/w hydrogen peroxide.

Figure 4:
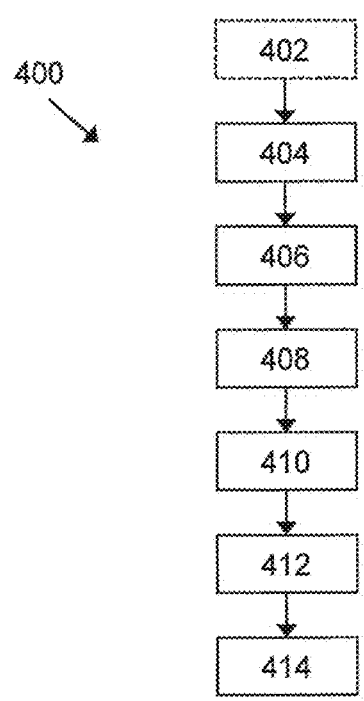
FIG. 4 is a flow diagram of a method of treating hair strands during a permanent hair reshaping process, according to an embodiment.

FIG. 4 is a flow diagram of a method 400 of permanently reshaping hair strands, according to an embodiment. Method 400 optionally includes a first operation 402, wherein hair strands receive tension prior to the reshaping process. In some embodiments, tension is applied by wrapping hair strands around a curler or other shaping substrate. Hair wrapped around a shaping substrate substantially conforms to the substrate after a permanent reshaping process is performed, providing an ability for a person to select and influence the final appearance of the hair strands. In some hair reshaping processes, such as hair straightening processes, hair strands can receive tension from the hair itself to achieve a final hair conformation.

Method 400 includes an operation 404, wherein hair disulfide bonds are cleaved to form disulfide-cleaved hair strands. The polypeptide backbone of dimers includes cysteine groups in each polypeptide strand. A cysteine group is an amino acid with a chemical formula $HO_2CCH(NH_2)CH_2SH$. The sulfur atom in a cysteine thiol (—SH) functional group is susceptible to reversible oxidation, according to the pH of the surrounding environment. Cysteine groups in different polypeptide strands of a dimer such as dimer 206 of FIG. 2 cross-link via a cysteine-to-cysteine disulfide (S—S) bond to form cysteine, a dimer of two cysteine groups. Cystine disulfide bonds cleave at high pH, or pH greater than about 8.0. Thus, sodium thioglycolate solutions with pH of around 9 are used to both lift cuticle cells and to cleave cysteine disulfide bonds when perming hair. Tension applied to the hair strand the disulfide bond is cleaved causes the polypeptide strands in dimers to move lengthwise along the dimer strand into a new configuration corresponding to a new hair conformation. Disulfide bonds reform when the pH is lowered to below about pH of 6, causing the hair strands to form new cystine groups and locking the hair in the new conformation.

High pH conditions conducive to raising the cuticle cells of a hair strand, and with cleaving cystine group disulfide bonds, are achieved on hair strands by applying solutions containing a reducing agent such as thioglycolate salts, cysteamine salts, inorganic hydroxides, sulfites, bisulfites, an organic base, and/or bromides to hair strands. In some embodiments, the reducing agent includes ammonium sulfite ($NH_4SO_3$) and/or ammonium bisulfite ($NH_4(SO_3)_2$). Other basic compounds not listed herein but known to practitioners having skill in the art are also compatible with lifting cuticle cells and cleaving cystine disulfide bonds. Generally, any reducing agent that, when applied with in solution containing the reducing agent, achieves a pH of at least 9.0 and not more than 14.0 for alkaline treatments and at least 5 but not more than 8 for acidic treatments, is capable of acting as a reducing agent in the disclosed method.

Method 400 includes operation 406, wherein the reducing agent is removed from hair strands. In an embodiment, the reducing agent is removed from hair strands by rinsing the hair strands with an excess of water during a hair reshaping process.

Method 400 includes operation 408, in which disulfide-cleaved hair strands are re-formed, locking hair into a new conformation. Disulfide bonds are re-formed by applying hydrogen peroxide solution to the hair strands. Hydrogen peroxide reduces the cysteine group sulfur atoms and triggers formation of cystine groups that span adjoining dimers of hair polypeptide strands by forming new disulfide bonds in new pairs of cysteine groups in the adjoining polypeptide strands. In some embodiments of method 400, operation 408 includes a step wherein hydrogen peroxide is removed from hair strands by rinsing with water. Rinsing peroxide from hair strands can reduce damage to hair strands.

Method 400 also includes operation 410, wherein CMC in the hair strands is repaired and/or restored and residual hydrogen peroxide on the hair is quenched. As described previously, CMC repair is performed by applying a CMC repair solution containing at least 18-MEA, fatty acids, and other lipids, to hair strands and allowing it to rest on hair strands to perform the repair function. A longer exposure of hair strands to CMC repair solution enhances the degree of CMC repair and restoration up to a threshold of CMC repair solution exposure, after which the rate of CMC repair and restoration decreases. Longer exposures of CMC repair solution to hair strands allows the CMC components contained in CMC repair solution to diffuse through the CMC repair solution to damage CMC in the hair strands and to self-assemble thereon to re-form the CMC.

As previously described, some embodiments of CMC repair solution remove residual hydrogen peroxide from hair strands. Acid in CMC repair solution also lowers cuticle cells to an initial cuticle cell configuration by lowering the pH to below about 6.0. In some embodiments of operation 410, CMC repair and restoration is performed by applying a first solution (CMC repair solution) to hair strands and a second solution (neutralizer solution) for neutralizing residual hydrogen peroxide. In some embodiments of operation 410, CMC repair and restoration and residual hydrogen peroxide neutralization are performed using a single solution. In some instances, the operation 410 further includes rinsing hair strands after CMC repair and hydrogen peroxide neutralization. In some instances, the operations 408 and 410 are combined into a single operation wherein the CMC repair solution comprises a mixture of CMC repair fatty acids, a concentration of acid to bring the CMC repair solution to a pH less than 6, and hydrogen peroxide, that triggers the disulfide bond re-forming described above, before the acid neutralizes the hydrogen peroxide.

Figure 5A:
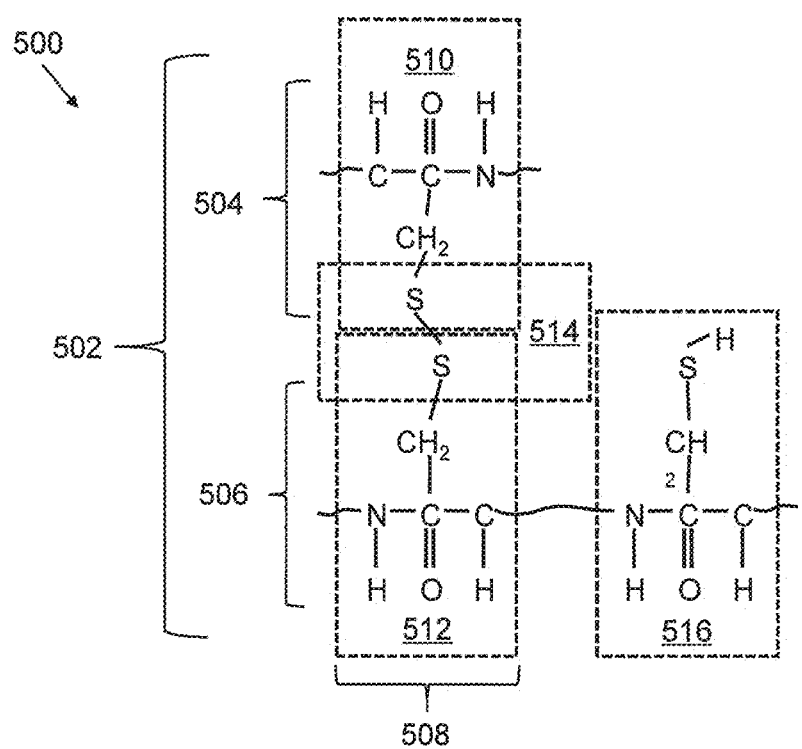
FIGS. 5A-5C are diagrams of polypeptide chains in a hair strand during a hair reshaping process, according to an embodiment.
Figure 5B:
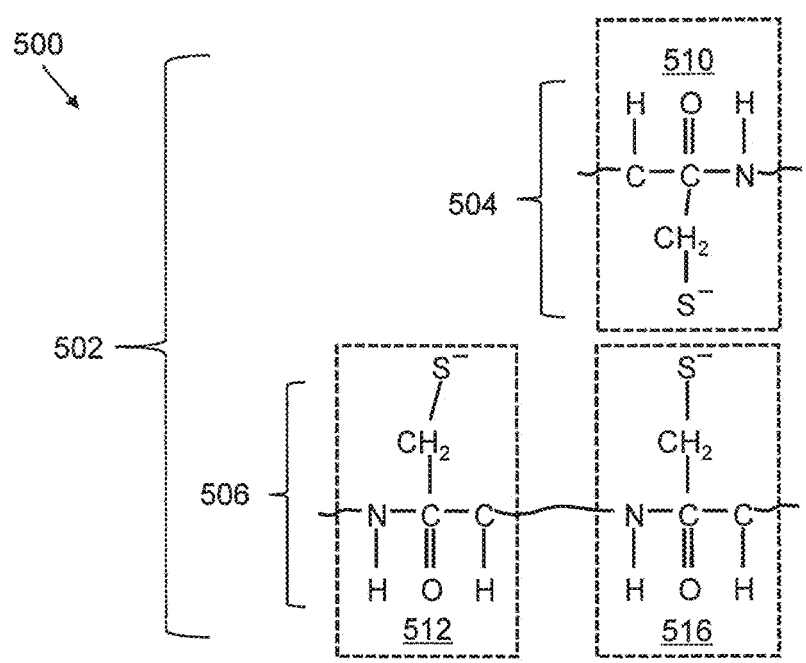
Figure 5C:
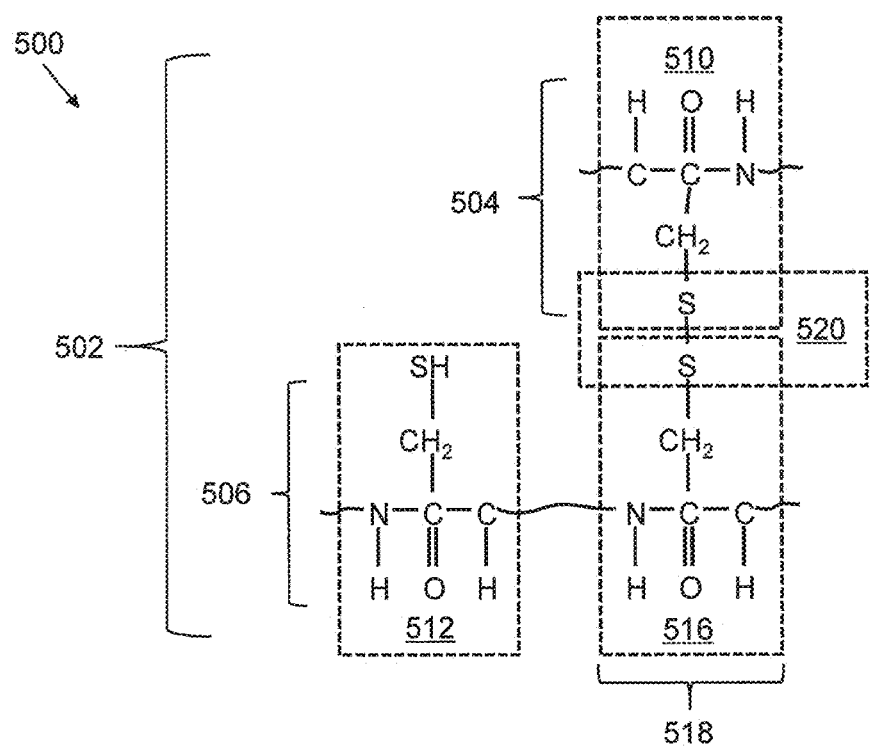

FIGS. 5A-5C are diagrams of polypeptide chains in a hair strand 500 during a hair reshaping process, according to some embodiments. FIG. 5A is a diagram of an initial chemical structure in a hair strand 500. Hair strand 500 includes a polypeptide dimer 502, including first polypeptide strand 504 and second polypeptide strand 506. Polypeptide dimer 502 includes a cystine group 508 that includes cysteine group 510 in first polypeptide strand 504 and cysteine group 512 in second polypeptide strand 506. Cysteine groups 510 and 512 are cross-linked by disulfide bond 514. Second polypeptide strand 506 also includes cysteine group 516, separated from cysteine group 512. Cysteine group 516 is not cross-linked to first polypeptide strand 504, but has a terminal thiol (—SH) group available for cross-linking in a permanent hair reshaping process. Cysteine groups 510, 512, and 516 are in a first configuration, prior to scission of disulfide bond 514.

FIG. 5B shows polypeptide dimer 502 in the first configuration after scission of disulfide bond 514. Each sulfur in cysteine groups 510, 512, and 516 has been reduced to a sulfide ion ($S^{13}$). Because disulfide bond 514 has been cleaved, first polypeptide strand 504 is free to move along the length of second polypeptide strand 506.

FIG. 5C shows polypeptide dimer 502 in a second configuration after scission of disulfide bond 514. Cysteine group 510 adjoins and is cross-linked to cysteine group 516 to form cystine group 518. Cysteine group 512 has been oxidized and contains a terminal thiol group. Disulfide bond 520 holds first polypeptide strand 504 and second polypeptide strand 506 in the second configuration and provides hair strand 500 a new shape after a permanent hair reshaping process.

Figure 6:
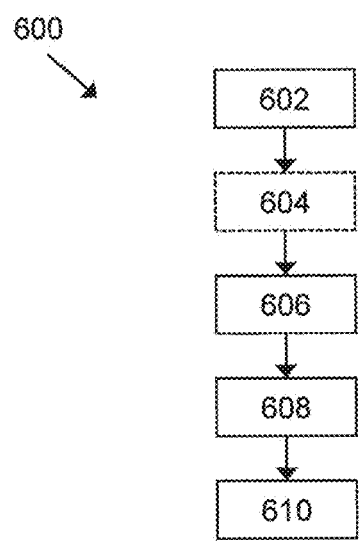
FIG. 6 is a flow diagram of a method of treating hair strands during a permanent hair coloring process, according to an embodiment.

FIG. 6 is a flow diagram of a method 600 of permanently coloring hair strands, according to an embodiment. In method 600, an operation 602 raises the cuticle cells of a hair strand. In permanent hair coloring, a reducing agent may be applied in a basic solution to hair strands to raise the cuticle and expose the cortex. In an embodiment, the reducing agent in a permanent hair coloring process is ammonia (NH3) and/or an ammonia-based reducing agent or other coloring-friendly base used in the cosmetology industry.

Operation 604 of method 600 relates to lightening hair strands during a hair coloring process. Hair strands may be lightened with developer solution, which contains a developer, or oxidizing agent, that breaks down melanin and any dye molecules previously-applied to the hair. Developer solution may be either high volume (i.e., having a high concentration of oxidizing agent) or low volume (having a lower concentration of oxidizing agent. In high volume developer solution, the fraction of oxidizing agent in solution ranges from about 10% to about 14% of total solution volume. In low volume developer solution, the fraction of oxidizing agent in solution ranges from about 4% to about 7% of total solution volume. Oxidizing agents for developing, or lightening, hair strands, include hydrogen peroxide ($H_2O_2$), sodium bromate ($NaBrO_3$), and/or other commercially available oxidizing agents.

Method 600 includes operation 606, in which hair is colored by applying colorant solution to hair strands. Colorant solution may include a mixture of: [1] 1,4-diaminobenzene and/or 2,5-diaminotoluene, and [2] a coupling agent. While traditional hair coloring solutions may include an oxidizing agent, such as hydrogen peroxide, in colorant solution applied to hair strands, in the present application, oxidizing agent is added to hair strands separate from the coupling agent and diaminobenzene/ diaminotoluene solution. Coupling agents include molecules such as blue coupler 1,3-diaminobenzene (and derivatives), red couplers 2-aminophenol, naphtol, and 1-methyl-4-aminophenol (and derivatives), and yellow-green couplers such as resorcinol and benzodioxozole and their derivatives. Colorant solution may include one or more coupling agents to regulate the final color of the hair strands after permanent-dye molecules are applied to hair strands. Basic solution reduces 1,4-diaminobenzene to phenylenediimine, and basic solution reduces 2,5-diaminotoluene to 2-methyl-quininonediimine, either of which maysubstitute, via electrophilic aromatic substitution, a coupler molecule to form a leuco (colorless) form of dye precursor molecules with the coupler molecules. The final color of a hair dye may be regulated by the proportions and total concentrations of red, yellow-green, and blue couplers in the dye mixture. In operation 608, leuco dye precursor molecules in a colorant solution on hair strands are oxidized to a final, colored form upon oxidation of the leuco dye precursor by oxidizing agent (hydrogen peroxide, etc. . . . ). In operation 608, oxidizing agent is applied to hair strands separately from hair colorant solution.

Operation 610 includes processes related to repairing CMC in the cuticle and cortex of hair strands and/or quenching the hydrogen peroxide used to trigger permanent dye molecule formation. In some embodiments of operation 610, CMC repair solution is applied to hair strands in order to trigger repair and restoration of CMC by self-assembly of CMC component molecules contained in CMC solution on damaged hair. As previously described in operation 410, CMC repair solution and acid solution may be added separately during a CMC repair solution. In a preferred embodiment, CMC repair solution with fatty acids contains an acid or buffered acid to simultaneously repair CMC and lower cuticle cells. In some instances, peroxide neutralization, as described above, and dye oxidization, as described in operation 608, occurs before the CMC repair. Products of peroxide neutralization, dye oxidization, and unreacted CMC repair fatty acids are removed from hair strands by rinsing with water.

In some instances, the methods of performing chemical processing of hair, described above in methods 500 and 600, are able to be combined into a single method, method 700, described below, wherein hair is chemically processed to both perm and color hair strands, followed by a CMC repair treatment, to restore hair CMC and prevent cuticle damage. CMC repair and reaction quenching after hair reshaping and/or hair coloring enables permanent reshaping and permanent hair coloring in a single hair treatment session, with tensile strength and internal lipid content that nearly matches or exceeds the tensile strength and internal lipid content of unprocessed, untreated hair. Tensile strength is related to hair damage, because damaged hair has lower hair tensile strength than hair that has not been damaged by chemical processing. Tensile strength test results are reported in Tables 1100 of FIG. 11A and table 1110 of FIG. 11B. Internal lipid content, or total lipid content, is related to hair damage because hair with reduced lipid content is more prone to breakage than hair that has not undergone chemical processing. Further, total lipid content is related to hair damage because damaged hair has less cuticle material than hair that has not been chemically processed to the point of cuticle loss. Gas chromatography—mass spectrometry (GSMS) analysis of internal lipid content and/or total lipid content of hair is reported in table 1300 of FIG. 13, and in chart 1400 of FIG. 14.

Permanent hair coloring methods and traditional permanent hair reshaping methods each involve separate cuticle lifting processes. Performing sequential hair perming and hair coloring processes, or, performing sequential cuticle lifting processes, according to manufacturer instructions and without CMC repair/quenching results in highly damaged hair like hair strand 1002 of FIG. 10.

Figure 7:
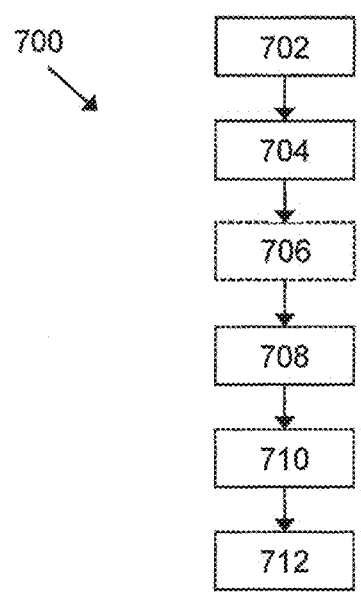
FIG. 7 is a flow diagram of a method for reshaping and coloring hair in a single cuticle-raising treatment, according to an embodiment.

FIG. 7 is a flow diagram of a method 700 for permanently reshaping and coloring hair in a single hair treatment, without hair damage, according to an embodiment. Method 700 includes operation 702, wherein a reducing agent is applied to hair strands. In some instances, the reducing agent is sodium thioglycolate or another high-pH reducing agent solution. As described above, the high-pH reducing agent solution has a pH of greater than about 9.0 in order to raise the cuticle cells and begin to cleave disulfide bonds in the hair. Method 700 continues with operation 704, relating to removing reducing agent from hair strands. Operation 704 is performed after cleaving of disulfide bonds in hair strands and the hair strands have begun to undergo reshaping, or conformational change. In some instances, the reducing agent is removed from hair strands by rinsing hair strands with an excess of water.

Method 700 includes an optional operation 706, wherein hydrogen peroxide, in the form of developer solution, is applied to hair. Developer solution uses hydrogen peroxide, to lighten hair prior to formation of permanent hair dyes in hair. Regarding the permanent hair reshaping, the hydrogen peroxide of developer solution further serves to trigger re-formation of disulfide bonds, locking the hair in a new shape. Thus, the hydrogen peroxide performs a function for both the perming and the permanent hair coloring processes. In some instances, operation 706 includes applying a high concentration of developer solution, as described above in operation 604, to the hair. In some instances, operation 706 includes applying a low concentration developer solution, as described in operation 604, to hair strands. In some embodiments, operation 706 includes a rinsing step, wherein developer is removed from hair strands. According to some embodiments of operation 706, developer is removed by rinsing with excess water.

Method 700 includes operation 708, in which dye precursors are added to hair strands in solution. The chemical processes associated with permanent dye formation are described above in operation 606 of method 600. Colorless dye precursor molecules undergo electrophilic aromatic substitution triggered by the residual basic chemistry remaining on hair strands following application of the disulfide-bond cleaving reducing agent to hair strands in operation 702. Because dye precursor molecules are applied to hair strands while the cuticle is already lifted, coloring occurs more quickly than when dye precursors are applied to hair strands along with the cuticle-raising solution. In some embodiments, the time to achieve a desired color concentration or density in hair strands being permed and colored ranges from around 1.5 to around 4 times faster than a time to achieve a similar desired color concentration or density in hair strands that are only being colored. In some embodiments, colorless dye precursor molecule residence time can be reduced by at least 30% because hair cuticle cells are already in a lifted position after performing operation 702 in method 700. Because cuticle cells are already lifted, colorless dye precursor molecules reach interior portions of hair strands more easily than in hair coloring processes performed alone.

Method 700 also includes operation 710, wherein permanent hair dye molecules are generated in situ on hair strands by addition of an oxidizing. Operation 710 resembles operation 608 of method 600, described above. In an embodiment of operation 710 the oxidizing agent is hydrogen peroxide. The oxidizing agent oxidizes the colorless dye precursors and renders them color-absorptive according to techniques known in the art of hair coloring.

Method 700 also includes operation 712, wherein CMC of the hair strands are repaired and residual hydrogen peroxide is quenched or neutralized. CMC repair solution containing CMC repair components such as 18-MEA, linoleic acid, stearic acid, oleic acid, and palmitic acid, or other related terminal fatty acids as described previously, is applied to hair strands to repair and/or restore hair strands that were damaged by application of the disulfide-bond cleaving reducing agent of operation 702 or subsequent processing steps. In some embodiments of operation 712, CMC repair and acid/hydrogen peroxide quenching are performed with separate solutions. In some embodiments of operation 712, CMC repair and acid/hydrogen peroxide quenching are performed using a single solution (quencher solution). Because CMC repair solution and/or quencher solution are pH buffered to a pH between around 4.0 and around 5.5, residual reducing agent on hair strands is neutralized upon application of the CMC repair solution and/or quencher solution to the hair strands and the cuticle cells are lower with the pH change.

Figure 8:
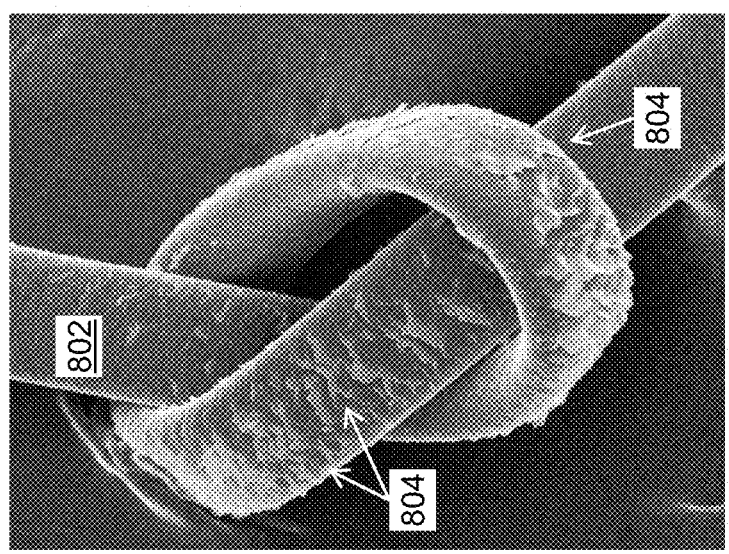
FIG. 8 is a scanning electron micrograph (SEM) image of an unprocessed, untreated hair strand, according to an embodiment.

FIG. 8 is a SEM micrograph 800 of an unprocessed, untreated hair strand 802, according to some embodiments. Hair strand 802 has been shampooed and conditioned, but has not undergone chemical processing (perming or coloring) or treatment with CMC repair solution/quencher. Cuticle cells 804 are visible on the surface of the hair strand 802 as flakes or layers that separate from the smooth surface of hair strand 802. FIG. 9 is a SEM micrograph 900 of a processed, treated hair strand 902, according to some embodiments. Hair strand 902 has been shampooed and conditioned, chemically processed with high lift bleach (a form of chemical processing that is highly prone to cuticle damage), and quenched with CMC repair solution without drying the hair. Hair strand 902 exhibits cuticle cells 904 that closely resemble the cuticle cells 804 of hair strand 802 in SEM micrograph 800. Cuticle cells 904 are visible on the surface of the hair strand 904 as flakes or layers that separate from the smooth surface of hair strand 902, just as on hair strand 802. FIG. 10 is a SEM micrograph 1000 of a processed hair strand 1002 without CMC repair treatment, according to an embodiment. Hair strand 1002 was shampooed and conditioned, as with hair strand 902, and was further processed with [1] a high lift bleach color process according to a set of manufacturer instructions for high lift bleach (see Example 3, below, for an analogous chemical process), followed by [2] a perm process according to a set of manufacturer instructions for chemical perming, (see Example 2, below, for an analogous chemical process). Hair strand 1002 has no remaining cuticle cells and the fibers 1006 of cortical cells are clearly visible. It is believed that the sequential cuticle lifting process of the high lift bleach color process, followed by hair drying, and the cuticle lifting process of the perm, followed by drying, dissolve and/or damage the hair cuticle layer, exposing the underlying cortical cell fibers 1006. Hair strand 1002 has greatly reduced tensile strength and is extremely prone to breakage.

EXAMPLES

Compounds used in these Examples were obtained from commercial chemical suppliers. Hair samples used to generate the experimental data included herein were collected from two adult Caucasian women. Hair sample 1 was divided into 8 test samples: TS 1.1 through TS 1.8, and hair sample is divided into 8 test samples: TS 2.1 through TS 2.8.

The first digit of a Test Sample identifier, either a 1 or a 2, refers to the hair sample number. Each test sample of TS 1.1-1.8 and TS 2.1-2.8 was prepared according to an Example section, below. The second digit of a test sample number refers to the Example used to prepare the test sample. Thus, test sample 2.4 refers to hair sample 2, subjected to preparation according to instructions included in Example 4, and so forth. Below, Examples 1-8 describe experimental procedures used to prepare hair samples for tensile strength evaluation and/or Gas Chromatography-Mass Spectroscopy (GCMS) analysis of hair lipid content. Example 9 describes a procedure used to create an embodiment of CMC repair solution that quenches reaction chemistry, according to an embodiment. Example 10 describes a procedure used to treat hair strands of the Test Samples. Example 11 describes a procedure for measuring tensile strength, according to an embodiment. Example 12 describes a procedure for measuring lipid content of hair, according to an embodiment.

Example 1

Test Samples 1.1 and 2.1 were cleaned with shampoo for 2 minutes, rinsed with water for 2 minutes, and allowed to air dry overnight and allowed to air dry overnight at around 20° C. with no further chemical processing or treatment.

Example 2

Test samples 1.2 and 2.2 were cleaned with shampoo for 2 minutes, rinsed with water for 2 minutes, and subjected to a chemical perm process as described below. After chemical perm processing, hair samples were rinsed with water for 2 minutes and allowed to air dry overnight at around 20° C. Test samples 1.2 and 2.2 were permed using commercially available Quantum Finn Options perm and neutralizer kit according to the provided instructions. Test samples 1.2 and 2.2 were processed for 20 minutes after sodium thioglycolate application to the hair, followed by rinsing and neutralizing for 5 minutes.

Example 3

Test samples 1.3 and 2.3 were cleaned with shampoo for 2 minutes, rinsed with water for 2 minutes, and subjected to a chemical color process as described below. After chemical color processing, hair samples were washed with shampoo, Joico Color Endure Shampoo which is recommended by the manufacturer, which was rinsed from hair and then conditioner applied, Joico Color Endure Conditioner, and rinsed from hair and allowed to air dry overnight at around 20° C.

Test sample 1.3 is brown hair and was colored using a commercially available Framesi brand Framcolor 2007 7NP hair coloring kit, suitable for coloring brown hair. The Framesi color was mixed in a 2:1 developer to color crème mixture. Test sample 2.3 is black hair and was colored using a commercially available Joico Vero lightening bleach, suitable for black hair coloring. The bleach was mixed in a 2:1 developer to bleach power mixture.

While the hair in test samples 1.3 and 2.3 was still wet from rinsing after shampoo, the coloring mix was applied to the hair strands for 20 minutes to allow colorant molecules to penetrate into hair strands.

Example 4

Test samples 1.4 and 2.4 were cleaned with shampoo for 2 minutes, rinsed with water for 2 minutes, and subjected to a [1] the chemical perm process as described above in Example 2, followed by [2] a suitable chemical color process as described above in Example 3 for the hair sample. After coloring, hair samples were rinsed with water for 2 minutes and allowed to air dry overnight at around 20° C.

Example 5

Test samples 1.5 and 2.5 were cleaned with shampoo for 2 minutes, rinsed with water for 2 minutes, and subjected to a cuticle lifting process using an ammonium hydroxide solution titrated with acetic acid to a pH of 9.0. The pH 9 solution is prepared by adding 5-6 drops of 7 Normal ammonium hydroxide to 100 mL water, with back titration using acetic acid to adjust a final solution pH. The pH 9 cuticle lifting solution was applied to hair strands for not more than 20 minutes, after which the hair was rinsed with water. CMC repair solution as described herein was applied to test samples 1.5 and 2.5 for 5 minutes, followed by a water rinse. Hair in test samples 1.5 and 2.5 was allowed to air dry overnight at around 20° C. with no further chemical processing or treatment.

Example 6

Test samples 1.6 and 2.6 were cleaned with shampoo for 2 minutes, rinsed with water for 2 minutes, and prepared with a chemical perm process as described above in Example 2. While the hair strands were still wet from a final water rinse after penning hair, the CMC repair solution was applied to the hair for 5 minutes, followed by a water rinse and air drying overnight.

Example 7

Test samples 1.7 and 2.7 were cleaned with shampoo for 2 minutes, rinsed with water for 2 minutes, and prepared with a chemical color process as described above in Example 3, where an appropriate hair coloring process is selected for each hair sample. Subsequent to a final water rinse in the hair color process of Example 3, test samples 1.7 and 2.7 were treated with CMC repair solution for 5 minutes, followed by a water rinse and air drying overnight.

Example 8

Test samples 1.8 and 2.8 were cleaned with shampoo for 2 minutes, rinsed with water for 2 minutes, and subjected to a [1] the chemical perm process as described above in Example 2, followed by [2] a suitable chemical color process as described above in Example 3 for the hair sample. After a final water rinse of the chemical color process described in Example 3, the test samples were treated with CMC repair solution for 5 minutes, followed by a water rinse and air drying overnight.

Example 9

An exemplary, and non-limiting example of a method of formulating CMC repair solution includes the following operations. Other formulations of CMC repair solution, with different proportions of fatty acids and emollient, are contemplated. Seven hundred grams of deionized water is heated to 70° C. The water is stirred with a magnetic Teflon stirbar in a glass beaker. Maintaining the temperature of the water at 90° C., 30 grams of tetrasodium EDTA, 30 grams of sodium acetate, and 40 grams of glacial acetic acid are added with stirring. After complete dissolution of the tetrasodium EDTA, sodium acetate, and glacial acetic acid in the beaker of water, 145 grams of avocado oil is added to the heated solution, followed by sequential additions of 70 grams of emollient, and 30 grams of 18-methyl eicosanoic acid (18-MEA). Avocado oil is a naturally occurring mixture of lipids and fatty acids that include branched and unbranched terminal fatty acids, and saturated and unsaturated terminal fatty acids. Fatty acids in avocado oil include linoleic acid, oleic acid, stearic acid, and palmitic acid. Other oils are contemplated within the scope of the present disclosure as a source of lipids and fatty acids for formulating CMC repair solution. The composition of the emollient includes, in some embodiments, ceatyl alcohol, glycerol stearate, or mixtures thereof. In one embodiment, 40 grams of ceatyl alcohol is added with stirring, followed by addition of 30 grams of glycerol stearate. Formulations not used within 24 hours of mixing include addition of one or more commercially available preservatives to prevent bacterial contamination or other types of light or biological formulation degradation. After complete mixing, the formulation was cooled to 25° C., and stirring was stopped. The formulation was stored in airtight amber bottles until application to hair test samples as disclosed herein.

Example 10

CMC repair solution is applied to hair strands with a brush that has been dipped into CMC repair solution after a final water rinse of the hair strands as indicated in the chemical processing associated with perming our coloring hair. Using a brush, a user is able to direct the brush to apply repair solution to specific regions of hair treated with chemical processing, while leaving other regions of hair untreated. Examples of chemical processing provided above in Examples two and three, above, are indicative of perming and coloring processes that end in a water rinse. CMC repair solution remains on the hair strands for a period of five minutes to promote rebuilding and repair of CMC layers on the hair strands. Periods of time longer than five minutes are also envisioned within the scope of this disclosure, although additional CMC repair treatment time does not appear to correlate with increased lipid content or improved tensile strength or hair texture. CMC repair treatment ends with a water rinse of the hair strands to remove excess or unreacted repair solution components and byproducts of neutralizing chemistry remaining on the hair strands when the repair solution was applied.

Example 11

Prior to tensile strength measurements, hair samples were soaked in deionized water for five minutes to ensure that the test samples were saturated. A first end of hair strand was fastened to a clamp, and a second end of the hair strand was fastened to a hook. Weights were applied to the hook, which was then dropped from a position adjacent to the clamp such that the weights produced a force along the length of the hair strand. Tensile strength was measured by placing an initial light weight on the hook, dropping the weight and hooks three times to attempt to break the hair strand, then increasing an amount of weight on the hook and repeating the dropping operation. Tensile strength data was recorded for hair strands that broke any position between the clamp and the hook end. Data was discarded from hair strands that broke at the hook or clamp positions. Tensile strength measurements were conducted until three measurements were recorded for mid-strand breakage, then the testing continued with a new test sample. The weight used to calculate hair tensile strength was the weight corresponding to a test immediately prior to the weight that broke the hair strand.

Example 12

Hair test samples 1.1-1.7 and 2.1-2.7 were prepared according to Examples 1-7, listed above. After drying overnight, hair test samples were rinsed with hexane to remove surface lipids from the hair strands and allowed to dry in air for at least 15 minutes. Lipids were extracted from hair strands using a procedure found in *Determination of physiochemical properties of delipidized hair* by McMullen et al., *J. Cosmet. Sci.*, 64, 355, 357-358 (September/October 2013), incorporated herein by reference. The samples were rinsed with methanol when moving between extraction solutions, and all solutions for a said sample were combined to measure a total extracted quantity of lipids from each hair sample. Extracted lipids were esterified by converting the fatty acid form to a methyl ester according to a procedure from *Preparation of fatty acid methyl esters for gas-liquid chromatography* by Ichihara and Fukubayashi, *J. Lipid Res.*, 51(3), 635-640, September 2009, incorporated herein by reference. Lipid quantities from hair test samples were characterized according to a procedure in *Characterizaton of the lipid composition at the proximal root regions of human hair* by Masukawa, Narita, and Imokawa, *J. Cosmet. Sci.*, 56, 1-16 (January/February 2005), which is incorporated herein by reference. Quantities of lipids extracted from hair test samples were measured in relation to a 5 µL methanol standard added to the extract, as per Masukawa et al, above. Lipid quantities were measured using an Agilent 6890NGC with an Agilent 5973 MS detector for 29 minutes per sample, initial temperature of 100 C and ramping up to 325 C. The results were normalized for the differing weights of the original samples. The samples were compared to a standard of lipids that was from sesame oil.

FIG. 11 is a table 1100 with average tensile strength measurements of hair strands prepared in accordance with one of Examples 1-8, as described above, and tested according to Example 11, above. The example description column of table 1100 describes chemical processing or treatment of the hair strands corresponding to the Example listed in the example number column of table 1100. The Test Sample column includes a test sample identifier associated with a particular portion of a hair sample subjected to preparation according to the Example number provided.

Figure 12:
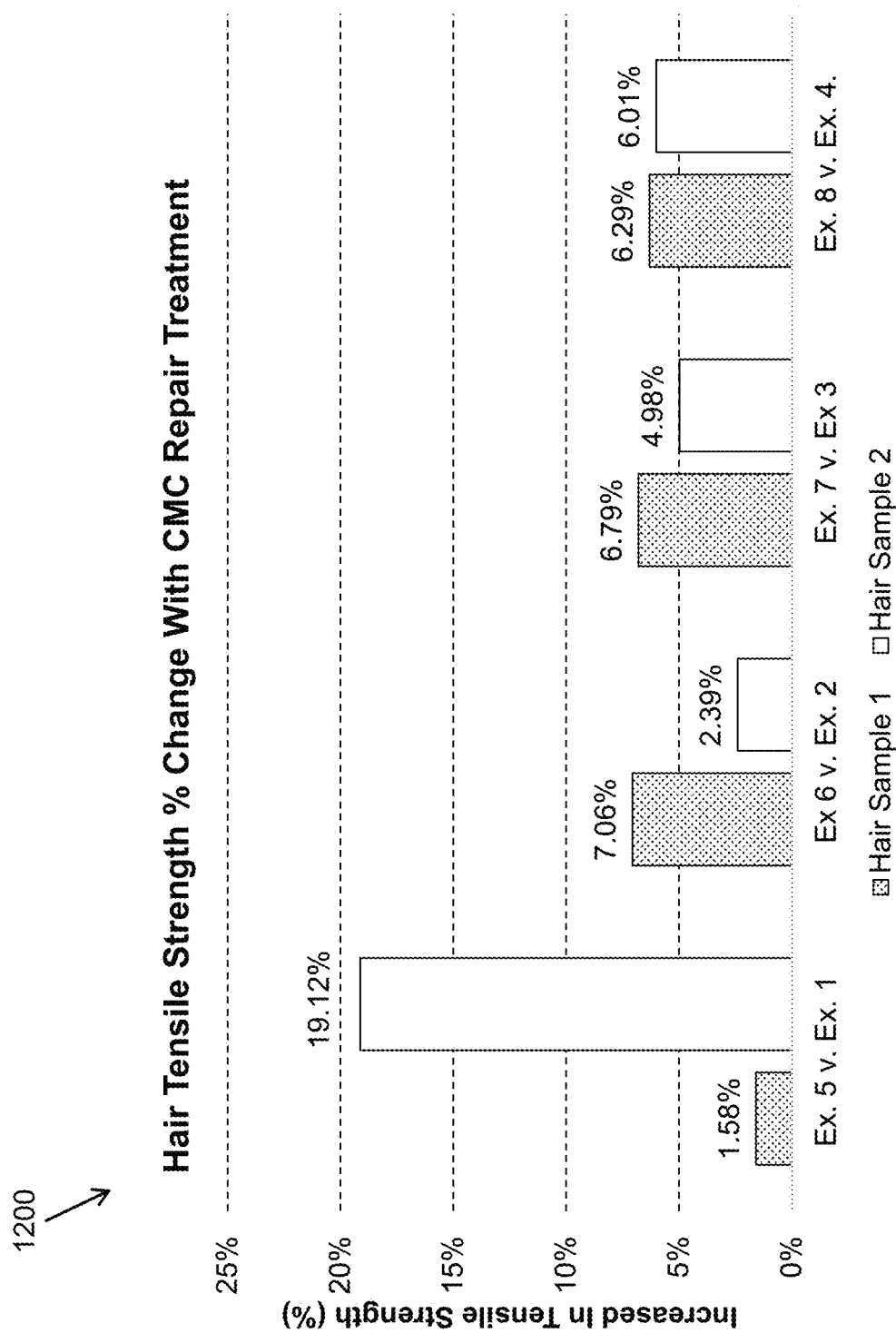
FIG. 12 is a chart of a difference in tensile strength between hair samples, according to an embodiment.

FIG. 12 is a chart 1200 showing a change in hair tensile strength for hair samples treated with CMC repair solution, and compared to samples treated with identical chemical processing, but without CMC repair treatment. For example, Example 5 describes processing of hair strands using a pH 9 solution to raise cuticle cells, followed by treatment of the hair strands with CMC repair solution, and the tensile strength of test samples 1.5 and 2.5 compared to the tensile strength of test samples 1.1 and 2.1, which were prepared using Example 1, which included no chemical processing or her treatment. The two leftmost columns in chart 1200, labeled "Ex. 5 v. Ex. 1" show the change in tensile strength of hair strands as described above.

The two columns in chart 1200, labeled "Ex. 6 v, Ex. 2" show the change in tensile strength of hair strands associated with CMC repair by comparing the tensile strength results from hair prepared according to Example 6 with respect to the hair prepared according to Example 2. Thus, test samples 1.6 and 2.6 show greater tensile strength than hair from test samples 1.2 and 2.2. The two columns in chart 1200, labeled "Ex. 7 v. Ex. 3" shows a difference in tensile strength of hair strands associated with CMC repair, by comparing the tensile strength results from hair prepared according to Example 7, with respect to the tensile strengths from hair prepared according to Example 2. Thus, test samples 1.7 and 2.7 show greater average tensile strength than test samples 1.3 and 2.3. Similarly, the two rightmost columns on chart 1200, labeled "Ex. 8 v. Ex. 4" show the difference in tensile strengths for test samples 1.8 and 2.8, prepared according to Example 8, with respect to test samples 1.4 and 2.4, prepared according to Example 4. In each case, hair tensile strength is greater after hair treatment using a cuticle lifting chemistry, such as sodium thioglycolate, ammonium thioglycolate, ammonia, or other basic solutions, followed by treatment with a CMC repair solution as described herein.

FIG. 13 is a table 1300 of amounts of extracted lipids from treated and untreated hair samples, according to an embodiment. Test samples listed in table 1300 correspond to the test samples described above and processed using the Examples described herein. The Example # column of table 1300 identifies a preparation used on hair samples prior to lipid extraction as described in Example 12.

FIG. 14 is a chart 1400 of differences in the extracted lipids between treated and untreated hair samples, according to an embodiment. Because the hair strands processed according to Example 12 were rinsed with hexane in order to remove surface lipids, the lipid quantities described in table 1300 and chart 1400 reflect the lipid content of an interior portion of hair strands. In chart 1400, for each group of columns described by a column label (e.g., TS 1.5 versus TS 1.1), the order of the columns corresponds to a legend of the chart indicating an identity of the lipid or fatty acid identified after the extraction process. The height of the columns indicates the difference between the amount of a given lipid in a test sample treated with CMC repair solution, and a test sample processed in a similar manner, but not treated with CMC repair solution.

Aspects of the present application relate to an aqueous solution for repairing hair chemical membrane complex (CMC). The aqueous solution comprises a mixture of 18-methyl eicosanoic acid (18-MEA) and one or more of palmitic acid, stearic acid, or linoleic acid.

Aspects of the present application relate to a method of reshaping hair, the method comprising applying a reducing agent solution to hair to form lifted-cuticle hair strands, reshaping the lifted-cuticle hair strands, and repairing chemical membrane complex (CMC) in the lifted-cuticle hair strands by applying a CMC repair solution to the lifted-cuticle hair strands.

Aspects of the present application relate to a method of perming and permanently coloring hair in a single treatment session. The method includes applying a reducing agent to hair to form lifted-cuticle hair strands, reshaping the lifted-cuticle hair strands, and rinsing the lifted-cuticle hair strands to remove the reducing agent. The method further includes applying colorless dye precursor molecules to lifted-cuticle hair strands, and applying a quencher solution to the lifted-cuticle hair strands, wherein the quencher solution includes CMC precursor species, an oxidizing agent, and a buffered acid.

The foregoing outlines features of several embodiments so that those skilled in the art may better understand the aspects of the present application. Those skilled in the art should appreciate that they may readily use the present application as a basis for designing or modifying other processes and structures for carrying out the same purposes and/or achieving the same advantages of the embodiments introduced herein. Those skilled in the art should also realize that such equivalent constructions do not depart from the spirit and scope of the present application, and that they may make various changes, substitutions, and alterations herein without departing from the spirit and scope of the present application. Those skilled in the art should also appreciate that the aforementioned methods may sometimes be modified by omitting some steps, or rearranging performance of some steps in various operations, without substantially deviating from the general principles of CMC repair and reaction quenching after chemical hair treatments described in the present application.

What is claimed is:

1. A hair treatment solution for hair with lifted cuticles, consisting of:
    water, wherein the hair treatment solution consists of at least 5% by volume of water;
    a first branched fatty acid, wherein the hair treatment solution consists of at least 1% and not more than 20% by volume of the first branched fatty acid;
    a first unbranched fatty acid, wherein
        the first branched fatty acid consists of a terminal fatty acid having a first alkyl substituent at a first substituent position on a main chain of the first branched fatty acid, the first substituent position being not less than 15, and not more than 21, carbon atoms away from a carboxyl group carbon of a terminal carboxylic acid, and
        a main chain of the first unbranched fatty acid consists of at least 12, and not more than 25, carbon atoms, including a carboxylic acid carbon; and
    an acetic acid and sodium acetate buffer system.

2. The hair treatment solution of claim 1, wherein a pH of the hair treatment solution is at least 4.0 and not more than 6.0.

3. The hair treatment solution of claim 1, wherein the first alkyl substituent of the first branched fatty acid is selected from the group consisting of a methyl group, an ethyl group, a propyl group, and an isopropyl group.

4. The hair treatment solution of claim 1, wherein the first branched fatty acid consists of 18-methyl eicosanoic acid (18-MEA).

5. The hair treatment solution of claim 1, wherein the first unbranched fatty acid is an unsaturated unbranched fatty acid.

6. The hair treatment solution of claim 5, wherein the unsaturated unbranched fatty acid is linoleic acid.

7. The hair treatment solution of claim 1, wherein the first unbranched fatty acid in the hair treatment solution is not less than 1% and not more than 10% by volume of the hair treatment solution.

8. The hair treatment solution of claim 1, wherein the first unbranched fatty acid is not less than 3% and not more than 15% by volume of the hair treatment solution.

9. The hair treatment solution of claim 1, wherein the first branched fatty acid and the first unbranched fatty acid collectively are not more than 20% by volume of the hair treatment solution.

10. The hair treatment solution of claim 1, wherein the first branched fatty acid is at least 1% and not more than 10% by volume of the hair treatment solution.

11. The hair treatment solution of claim 1, further consisting of at least 1% and not more than 8% by volume of hydrolyzed keratin protein.

12. A hair treatment solution, consisting of:
at least 5% by volume of water;
not less than 2% and not more than 20% by volume of a first branched fatty acid wherein
the first branched fatty acid is a terminal fatty acid having a first alkyl substituent at a first substituent position on a main chain of the first branched fatty acid, the first substituent position being not less than 15, and not more than 21, carbon atoms away from a carboxyl group carbon of a terminal carboxylic acid;
not less than 1% and not more than 10% by volume of the hair treatment solution of a first unbranched fatty acid wherein
a main chain of the first unbranched fatty acid has at least 12, and not more than 25, carbon atoms, including a carboxylic acid carbon; and
an acetic acid and sodium acetate buffer system.

13. The hair treatment solution of claim 12, wherein a pH of the hair treatment solution is at least 4.0 and not more than 6.0.

14. The hair treatment solution of claim 12, wherein the first alkyl substituent of the first branched fatty acid is selected from the group consisting of a methyl group, an ethyl group, a propyl group, and an isopropyl group.

15. A hair treatment solution, consisting of:
at least 5% by volume of water;
not less than 1% and not more than 10% by volume of a first branched fatty acid, wherein
the first branched fatty acid is a terminal fatty acid having a first alkyl substituent at a first substituent position on a main chain of the first branched fatty acid, the first substituent position being not less than 15, and not more than 21, carbon atoms away from a carboxyl group carbon of a terminal carboxylic acid;
not less than 1% and not more than 10% by volume of a first unbranched fatty acid wherein
a main chain of the first unbranched fatty acid has at least 12, and not more than 25, carbon atoms, including a carboxylic acid carbon; and
a buffer system consisting of a weak acid and a conjugate weak base.

16. The hair treatment solution of claim 15, further consisting of:
not less than 1% and not more than 10% by volume of a mixture of branched fatty acids consisting of the first branched fatty acid and a second branched fatty acid; and
not less than 1% and not more than 10% by volume of a mixture unbranched fatty acids consisting of the first unbranched fatty acid and a second unbranched fatty acid.

17. The hair treatment solution of claim 16, further consisting of:
not less than 2% and not more than 20% by volume of a total fatty acid mixture of the mixture of branched fatty acids and the mixture of unbranched fatty acids.

18. The hair treatment solution of claim 15, wherein:
the buffer system consists of a mixture of acetic acid and sodium acetate.

* * * * *